(12) United States Patent
Chen et al.

(10) Patent No.: US 10,149,380 B2
(45) Date of Patent: Dec. 4, 2018

(54) RESIN COMPOSITION AND ITS USE

(71) Applicant: Shengyi Technology Co., Ltd., Guangdong (CN)

(72) Inventors: Guangbing Chen, Guangdong (CN); Xianping Zeng, Guangdong (CN)

(73) Assignee: SHENGYI TECHNOLOGY CO., LTD. (CN)

( * ) Notice: Subject to any disclaimer, the term of this patent is extended or adjusted under 35 U.S.C. 154(b) by 626 days.

(21) Appl. No.: 14/647,672

(22) PCT Filed: Jan. 21, 2013

(86) PCT No.: PCT/CN2013/070774
§ 371 (c)(1),
(2) Date: May 27, 2015

(87) PCT Pub. No.: WO2014/082386
PCT Pub. Date: Jun. 5, 2014

(65) Prior Publication Data
US 2015/0313012 A1    Oct. 29, 2015

(30) Foreign Application Priority Data
Nov. 27, 2012   (CN) .......................... 2012 1 0492434

(51) Int. Cl.
*H05K 1/03* (2006.01)
*C08J 5/24* (2006.01)
(Continued)

(52) U.S. Cl.
CPC ........... *H05K 1/0366* (2013.01); *B32B 15/14* (2013.01); *B32B 15/20* (2013.01); *C08G 65/485* (2013.01);
(Continued)

(58) Field of Classification Search
CPC .... H05K 1/0366; H05K 1/0373; H05K 3/022; H05K 2201/0209; H05K 2201/012;
(Continued)

(56) References Cited

U.S. PATENT DOCUMENTS

| | | | |
|---|---|---|---|
| 5,916,952 A | 6/1999 | Romenesko et al. | |
| 6,339,131 B1 * | 1/2002 | Cella .................... | C08G 65/485 525/474 |

(Continued)

FOREIGN PATENT DOCUMENTS

| | | | |
|---|---|---|---|
| CN | 101328304 | * | 12/2008 |
| CN | 101423658 A | | 5/2009 |

(Continued)

OTHER PUBLICATIONS

English Abstract of CN102161823(A).
(Continued)

*Primary Examiner* — Cephia D Toomer
(74) *Attorney, Agent, or Firm* — McDonald Hopkins LLC

(57) ABSTRACT

Disclosed in the present invention is a resin composition, comprising a modified polyphenylene ether resin and an organic silicon compound containing unsaturated double bonds. Also disclosed is a method for preparing a high-frequency circuit substrate using the resin composition as described above and a high-frequency circuit substrate obtained by the preparation method. The high-frequency circuit substrate of the present invention has a high glass transition temperature, a high thermal decomposition temperature, a high interlayer adhesive force, a low dielectric constant and a low dielectric loss tangent, and is very suitable as a circuit substrate in a high-frequency electronic device.

17 Claims, 1 Drawing Sheet

(51) Int. Cl.
| | |
|---|---|
| *C08K 5/5425* | (2006.01) |
| *C08K 5/549* | (2006.01) |
| *C08L 71/12* | (2006.01) |
| *C08L 83/04* | (2006.01) |
| *B32B 15/14* | (2006.01) |
| *B32B 15/20* | (2006.01) |
| *C08G 65/48* | (2006.01) |
| *C08K 5/3417* | (2006.01) |
| *C08K 5/53* | (2006.01) |
| *C08L 71/00* | (2006.01) |
| *C08G 77/20* | (2006.01) |
| *H05K 3/02* | (2006.01) |

(52) U.S. Cl.
CPC .............. *C08J 5/24* (2013.01); *C08K 5/3417* (2013.01); *C08K 5/53* (2013.01); *C08K 5/549* (2013.01); *C08K 5/5425* (2013.01); *C08L 71/00* (2013.01); *C08L 71/12* (2013.01); *C08L 71/126* (2013.01); *C08L 83/04* (2013.01); *H05K 1/0373* (2013.01); *B32B 2260/021* (2013.01); *B32B 2260/046* (2013.01); *B32B 2262/101* (2013.01); *B32B 2305/076* (2013.01); *B32B 2307/204* (2013.01); *B32B 2307/3065* (2013.01); *B32B 2457/08* (2013.01); *C08G 77/20* (2013.01); *H05K 3/022* (2013.01); *H05K 2201/012* (2013.01); *H05K 2201/0209* (2013.01)

(58) Field of Classification Search
CPC .... C08K 5/5425; C08K 5/549; C08K 5/3417; C08K 5/53; C08L 71/12; C08L 77/20; C08L 71/00; C08L 71/126; B32B 15/14; B32B 2260/021; B32B 2260/046; B32B 2262/101; B32B 2305/076; B32B 15/20; B32B 2307/204; B32B 2307/3065; B32B 2457/08; C08G 77/20; C08G 65/485
See application file for complete search history.

(56) References Cited

U.S. PATENT DOCUMENTS 9,783,653 B2 * 10/2017 Igualada ............... C08K 3/346
2008/0071817 A1 3/2008 Gaurav et al.

FOREIGN PATENT DOCUMENTS

| | | |
|---|---|---|
| CN | 101434753 | 5/2009 |
| CN | 102161823 A | 8/2011 |
| EP | 1242504 B1 | 9/2002 |
| JP | H09302140 A | 11/1997 |
| TW | 200909458 | 3/2009 |
| TW | 200936666 | 9/2009 |

OTHER PUBLICATIONS

English Abstract of JPH09302140(A).
International Search Report for PCT/CN2013/070774 dated Aug. 22, 2013.
ISA/EP International Search Report and Written Opinion, prepared for European Application No. 13858022, dated May 25, 2016.
Huang et al., "A Study of the Properties and Topological Trapping of Cyclic Poly in Poly Networks," Journal of Polymer Science, 1990, 1807-1812, vol. 28 No. 7, Polymer Chemistry Edition, New York.
Weiyu Huang et al., "Poly (2,6-dimethyl-1,4-phenylene oxide/ Poly(dimethylsiloxane) System-Architecture and Selected Properties," Macromolecular Chemistry and Physics, 1989, 137-145, vol. 15, No. Suppl. 15, State University of New York.
Shinetsu Chem Co Ltd., "Data Base WPI," Week 200944, Thomson Scientific, 2009, London.

* cited by examiner

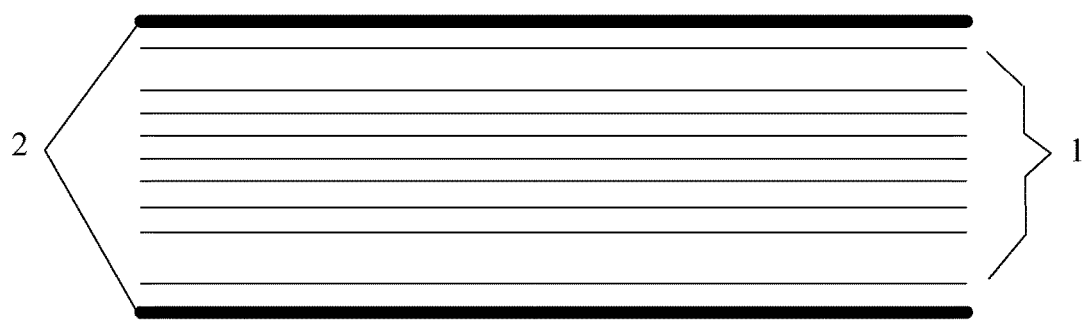

RESIN COMPOSITION AND ITS USE

CROSS-REFERENCE TO RELATED APPLICATIONS

This application is a national phase of PCT Application No. PCT/CN2013/070774 entitled, "A RESIN COMPOSITION AND ITS USE," filed on Jan. 21, 2013, which claims priority to Chinese Patent Application No. 201210492434.9 entitled "A RESIN COMPOSITION AND ITS USE," filed on Nov. 27, 2012, both of which are hereby incorporated by reference in their entirety.

TECHNOLOGY FIELD

The present invention relates to a resin composition. In particular, the present invention relates to a resin composition and its use in the high frequency circuit base plate.

BACKGROUND

In recent years, with the development of electronic information technology, the miniaturization and densification of electronic device installation and high volume and frequency of information, there is a higher demand for overall properties of the circuit base plate including heat resistance, water absorption, chemical resistance, mechanical properties, dimensional stability, and dielectric properties.

In term of dielectric properties, in a high frequency circuit, the relationship between signal transmission rate and the dielectric constant $D_k$ of insulating material is: the lower the insulating material dielectric constant $D_k$, the faster the signal transmission rate. Therefore in order to get high signal transmission rate, the development of low dielectric constant base plates is required. With the increase of the signal frequency, the signal loss in the base plate cannot be ignored. The relationship between the signal loss and the frequency, the dielectric constant, $D_k$, and the dielectric loss factor, $D_f$, is: the lower the base plate dielectric constant $D_k$ and the dielectric loss factor $D_f$, the lower the signal loss. Therefore the development of high frequency circuit base plate, which has a low dielectric constant $D_k$, a low dielectric loss factor $D_f$ and good heat resistance, becomes the common concern of the R&D direction of CCL factories.

There are lots of benzene rings in the polyphenylether resin molecular structure and there are not any strong polar groups. These properties give the polyphenylether resin its excellent properties such as high glass transition temperature, good dimensional stability, low coefficient of linear expansion, and low water absorption, especially excellent low dielectric constant and low dielectric loss. However, as a thermoplastic resin, the polyphenylether resin has some shortcomings, such as high resin melting temperature, poor processability, poor solvent resistance, etc. Due to the excellent physical properties, high heat resistance, chemical properties and electric properties of the polyphenylether resin, some big companies are interested in modifying the resin and some have achieved results. For example, the active groups have been introduced to the terminal or side chain of the polyphenylether molecule to make the polyphenylether resin into a thermosetting resin. After thermosetting, the resin has excellent overall properties such as heat resistance and dielectric properties, making it an ideal material for preparing high frequency circuit base plate.

In general, the way to use the modified polyphenylether resin comprising active groups in the terminal or side chains which can be cured, is to form a resin composition by coupling with a cross-linker. The cross-linker brings active groups that can react with modified polyphenylether. According to the literature, for the modified polyphenylether with C=C double bonds, the cross-linkers normally used include, e.g., polybutadiene, butadiene styrene copolymer, etc.

CN101370866A discloses the use of polyphenylether, butadiene, and bismaleimide resin composition in the preparation of a high frequency circuit base plate. Although the overall properties such as the dielectric of the plate are excellent, the butadiene reduces the heat resistance of the plate.

CN102161823 discloses the use of a resin composition copolymerized by a modified polyphenylether, a modified polybutadiene containing polar groups or a modified butadiene styrene copolymer containing polar groups with styrene in the preparation of a high frequency circuit base plate. Although the overall properties of the plate are excellent, the copolymer of polybutadiene or butadiene with styrene reduces the heat resistance and interlayer adhesion strength of the plate. Moreover, the polar groups on the molecular chain result in the increase of the water absorption rate and deterioration of the dielectric properties.

DESCRIPTION OF THE DRAWINGS

The technical solution of the present invention is further described referring to the following FIGURE and embodiments:

FIG. 1 shows a diagram of the high-frequency circuit base plate of the present invention.

DETAILED DESCRIPTION

In contrast to the problems of the prior art, an object of this invention is to provide a resin composition that has low dielectric constant $D_k$, low dielectric loss factor $D_f$, excellent heat resistance and water absorption, etc., fulfilling the requirements of a high frequency circuit base plate to dielectric property, heat resistance, and inter-layer adhesion strength, as well as being useful for the preparation of the high frequency circuit base plate.

To achieve the objective, the present invention employs the following technical solutions:

A resin composition comprises of a modified polyphenylether resin and an silicone compound containing unsaturated double bonds.

The modified polyphenylether resin is a solid powdery thermosetting resin at room temperature, which contains active unsaturated double bonds in the two ends and can conduct a radical polymerization and curing in the presence of curing initiator to produce the thermosetting resin that has excellent overall properties such as heat resistance dimensional stability, low water absorption rate, dielectric property, etc.

When the silicone compound containing unsaturated double bonds is used as a cross-linker for the modified polyphenylether, the cross-linking density of the resin composition is high after curing, providing a high glass transition temperature of the high-frequency circuit base plate. Meanwhile, the silicone compound containing unsaturated double bonds does not contain polar groups, guaranteeing the water absorption rate and excellent dielectric properties of the high-frequency circuit base plate. The silicone has good heat resistance, providing an excellent heat resistance property of the high-frequency circuit base plate. And, the prepared high-frequency circuit base plate has a high interlayer adhesion strength, improving the reliability of the plate.

The modified polyphenylether resin has excellent low dielectric constant, low dielectric loss tangent and the like. When the silicone compound containing unsaturated double bonds is used as the cross-linker for the modified polyphenylether resin, the prepared high-frequency circuit base plate has excellent overall properties such as dielectric property, water absorption, PCT property, etc. Compared to using polybutadiene/butadiene styrene copolymer as the cross-linker, the base plate has higher heat resistance and interlayer adhesion strength.

The modified polyphenylether resin has the following structure:

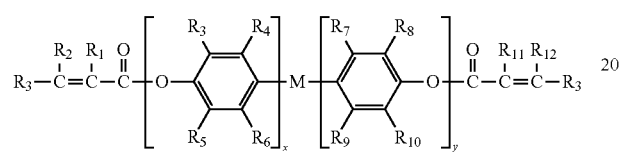

wherein, $0 \leq x \leq 100$, $0 \leq y \leq 100$, $2 \leq x+y \leq 100$, and x and y is not 0 at the same time. For example, $15 < x+y < 30$, $25 < x+y < 40$, $30 < x+y < 55$, $60 < x+y < 85$, $80 < x+y < 98$, etc. M is selected from:

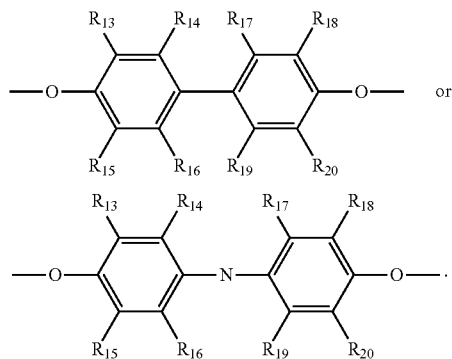

N is any one selected from —O—, —S—, —CO—, SO, —SC—, —SO$_2$— and —C(CH$_3$)$_2$—. $R_3$, $R_5$, $R_8$, $R_{10}$, $R_{13}$, $R_{15}$, $R_{18}$ and $R_{20}$ are independently selected from substituted/unsubstituted C1-C8 linear chain alkyl groups, substituted/unsubstituted C1-C8 branch chain alkyl groups and substituted/unsubstituted phenyl groups. $R_4$, $R_6$, $R_7$, $R_9$, $R_{14}$, $R_{16}$, $R_{17}$ and $R_{19}$ are independently selected from hydrogen atom, substituted/unsubstituted C1-C8 linear chain alkyl groups, substituted/unsubstituted C1-C8 branch chain alkyl groups and substituted/unsubstituted phenyl groups. $R_1$, $R_2$, $R_{11}$, $R_{12}$ are independently selected from substituted/unsubstituted C1-C8 linear chain alkyl groups and substituted/unsubstituted C1-C8 branch chain alkyl groups.

Preferably, the number average molecular weight of the modified polyphenylether resin is 500-10000 g/mol; preferably, 800~8000 g/mol; further preferably, 1000~7000 g/mol.

The silicone compound containing unsaturated double bonds is selected from the silicone compound structures containing unsaturated double bonds:

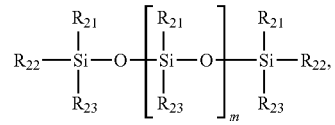

wherein $R_{21}$, $R_{22}$ and $R_{23}$ are independently selected from substituted/unsubstituted C1-C8 linear chain alkyl groups, substituted/unsubstituted C1-C8 branch chain alkyl groups, substituted/unsubstituted phenyl groups and C═C containing substituted/unsubstituted C2-C10 groups; at least one of $R_{21}$, $R_{22}$ and $R_{23}$ is C═C containing substituted/unsubstituted C2-C10 groups; and $0 \leq m \leq 100$; and

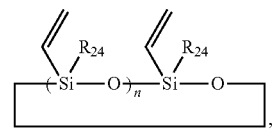

wherein $R_{24}$ is selected from substituted/unsubstituted C1-C12 linear chain alkyl groups and substituted/unsubstituted C1-C12 branch chain alkyl groups; $2 \leq n \leq 10$, and n is a natural number. The silicone compound containing unsaturated double bonds has a ring structure, i.e. Si atom and O atom are linked together without any other group between them. For example, the double bond silicone compound containing unsaturated double bonds may be WD-V4 (WD Silicone).

The silicone compound containing unsaturated double bonds has a high content of unsaturated double bonds; it forms spatial three-dimensional network structure with high density of cross linking, having a high glass transition temperature, containing no polar groups, and possessing excellent dielectric properties. The whole molecular structure of the silicone compound containing unsaturated double bonds has a ring structures formed by Si—O bonds and has a good heat resistance, which improves the heat resistance of the cured resin mixture systems.

Preferably, the resin composition in the present invention further comprises a free radical initiator. The radical initiator plays a role in initiating the cross linking, polymerization, and curing of the resin system. Upon heating, the radical initiator is decomposed to generate radicals, which initiate the cross linking among the active groups of the resin system to form cross-linked network structure with a spatial three dimensional structure.

Preferably, the free radical initiator is selected from organic peroxide initiators; further preferably, any one or a mixture of at least two selected from di-tert-butyl peroxide, dilauroyl peroxide, dibenzoyl peroxide, cumyl peroxyneodecanoate, tert-butyl peroxyneodecanoate, tert-amyl peroxy pivalate, tert-butyl peroxypivalate, tert-butyl peroxyisobutyrate, hexaneperoxoic acid-3,5,5-trimethyl-1,1-dimethylethyl ester, tert-butyl peroxyacetate, tert-butylperoxy benzoate, 1,1-di-(tert-butylperoxy)-3,3,5-trimethylcyclohexane, 1,1-di(tert-butylperoxy)cyclohexane, 2,2-di(tert-butylperoxy)butane, bis(4-tert-butylcyclohexyl) peroxydicarbonate, hexadecyl peroxydicarbonate, tetradecyl peroxydicarbonate, di-tert amyl peroxide, dicumyl peroxide, bis(1-(tert-butylperoxy)-1-methylethyl)-benzene, 2,5-dimethyl-2,5-di(tert-butyl peroxide)hexane, 2,5-dimethyl-2,5-di(tertiary-butylperoxy)-hexyne-3, diisopropylbenzenehydroperoxide (DIBHP), isopropyl benzene hydroperoxide, tert-amyl hydroperoxide, tert-butyl hydroperoxide, cumyl t-butyl peroxide, diisopropylbenzenehydroperoxide (DIBHP), tert-butyl peroxy-2-ethylhexanoate, tert-butylperoxy 2-ethylhexyl carbonate, butyl 4,4-bis(tert-butyldioxy)valerate, methyl ethyl ketone peroxide and peroxide cyclohexane.

Preferably, the resin composition further comprises a flame retardant. Preferably, the flame retardant is selected from one or a mixture of at least two retardants selected from halogenated flame retardants, phosphorus flame retardants, or nitrogen flame retardants; more preferably, one or a mixture of at least two selected from brominated flame retardants, phosphorus flame retardants or nitrogen flame retardants.

Preferably, the brominated flame retardant is selected from one or a mixture of at least two selected from decabromodiphenyl oxide, DBDPE and ethylene bis(tetrabromophthalimide). The mixture is, for example, the mixture of DBDPE and phenyl-hexabromide, the mixture of decabromodiphenyl oxide and ethylene bis(tetrabromophthalimide), the mixture of DBDPE, phenyl-hexabromide and decabromodiphenyl oxide, or the mixture of bis(tetrabromophthalimide), DBDPE, phenyl-hexabromide and decabromodiphenyl oxide.

Preferably, the phosphorus flame retardant is selected from one or a mixture of at least two selected from tris(2,6-dimethylphenyl)phosphine, 10-(2,5-Dihydroxyphenyl)-1OH-9-oxa-10-phospha-phenantbrene-10-oxide, 2,6-bis(2,6-dimethylphenyl)phosphinophenyl or 10-phenyl-9,10-Dihydro-9-oxa-10-phosphaphenanthrene 10-oxide. The mixture is, for example, the mixture of 10-phenyl-9,10-Dihydro-9-oxa-10-phosphaphenanthrene 10-oxide. and 2,6-bis(2,6-dimethylphenyl)phosphinophenyl, the mixture of 10-(2,5-Dihydroxyphenyl)-10H-9-oxa-10-phospha-phenantbrene-10-oxide and tris(2,6-dimethylphenyl)phosphine, the mixture of 10-phenyl-9,10-Dihydro-9-oxa-10-phosphaphenanthrene 10-oxide, 2,6-bis(2,6-dimethylphenyl)phosphinophenyl and 10-(2,5-Dihydroxyphenyl)-10H-9-oxa-10-phospha-phenantbrene-10-oxide, or the mixture of tris(2,6-dimethylphenyl)phosphine, 10-phenyl-9,10-Dihydro-9-oxa-10-phosphaphenanthrene 10-oxide and 2,6-bis(2,6-dimethylphenyl)phosphinophenyl.

Preferably, the nitrogen flame retardant is selected from one or the mixture of at least two of melamine, melamine phosphate, guanidine phosphate, guanidine carbonate, or guanidine sulfamate. The mixture is, for example, the mixture of guanidine sulfamate and guanidine carbonate, the mixture of guanidine phosphate and melamine phosphate, the mixture of melamine and guanidine sulfamate, the mixture of guanidine carbonate, guanidine phosphate and melamine, or the mixture of melamine phosphate, guanidine sulfamate, melamine and guanidine phosphate, preferably, the melamine and/or melamine phosphate.

Preferably, the resin composition compromises a powder filler. Preferably, the powder filling material is one or a mixture of at least two selected from crystalline silica, amorphous silica, spherical silica, fused silica, titania, silicon carbide, glass fiber, alumina, aluminum nitride, boron nitride, barium titanate and strontium titanate. The mixture is, for example, the mixture of crystalline silica and amorphous silica, the mixture of spherical silica and titania, the mixture of silicon carbide and glass fiber, the mixture of alumina and aluminum nitride, the mixture of boron nitride and barium titanate, the mixture of strontium titanate and silicon carbide, or the mixture of spherical silica, crystalline silica and amorphous silica. In the resin composition of the present invention, powder filler may improve dimensional stability, lower the thermal expansion coefficient, and reduce the cost of the system and so on. The invention does not restrict the shape and diameter of the powder filler; the normally used powder fillers have a diameter ranging from 0.2-10 µm, for example, 0.5 µm, 1 µm, 2 µm, 3 µm, 5 µm, 8 µm, or 9 µm. For example, the spherical silica that has a diameter of 0.2-10 µm can be chosen.

In the resin composition taking the weight of the modified polyphenylether resin as 100 parts by weight, the silicone compound containing unsaturated double bonds accounts for 10~90 parts by weight, for example, 15 parts by weight, 20 parts by weight, 30 parts by weight, 40 parts by weight, 50 parts by weight, 60 parts by weight, 70 parts by weight, or 80 parts by weight; and taking the total weight of modified polyphenylether resin and the silicone compound containing unsaturated double bonds as 100 parts by weight, the free radical initiator accounts for 1-3 parts by weight and the flame retardant accounts for 0-40 parts by weight. The free radical initiator accounts for 1.2 parts by weight, 1.4 parts by weight, 1.6 parts by weight, 1.8 parts by weight, 2.0 parts by weight, 2.2 parts by weight, 2.4 parts by weight, 2.6 parts by weight, 2.8 parts by weight or 2.9 parts by weight. By selecting the content of the free radical initiator of the present invention, an appropriate reaction rate can be obtained in the curing process. Excellent curing can be obtained in the curing process of preparing the prepreg and high-frequency circuit base plate.

The flame retardant accounts for, for example, 1 parts by weight, 3 parts by weight, 7 parts by weight, 11 parts by weight, 15 parts by weight, 19 parts by weight, 23 parts by weight, 27 parts by weight, 31 parts by weight, 35 parts by weight, 38 parts by weight or 39 parts by weight of the composition. The flame retardant accounting for 0 parts by weight means there is no flame retardant in the resin composition. The heat resistance and the adhesion strength between the layers will be reduced if the content of the flame retardant is too high.

Taking the total weight of modified polyphenylether resin, the silicone compound containing unsaturated double bonds and the flame retardant as 100 parts by weight, the powder filler accounts for 0~150 parts by weight.

The powder filler accounts for, for example, 5 parts by weight, 15 parts by weight, 25 parts by weight, 35 parts by weight, 45 parts by weight, 55 parts by weight, 75 parts by weight, 90 parts by weight, 100 parts by weight, 110 parts by weight, 120 parts by weight, 130 parts by weight, 140 parts by weight and 145 parts by weight. The weight of the powder filler accounting for 0 parts by weight means there is no powder filler in the resin composition.

The term of "comprising" in the present invention means, in addition to the mentioned components, other components may be included, which give the resin composition different properties. The term can also be replaced with a close-ended term "of" or "consists of."

For example, the resin composition of the present invention may include a thermosetting resin, for example, a epoxy resin, a cyanate ester resin, a phenol resin, a urethane resin, a melamine resin, etc. The curing agent and/or curing agent accelerator of the thermosetting resin may be also added to the resin composition.

Further, the resin composition may further contain various additives, for example, a silane coupling agent, a titanate coupling agent, an antioxidant, a heat stabilizer, an antistatic agent, a ultraviolet absorber, a pigment, a colorant, a lubricant, etc. The thermosetting resin and various additives can be used alone, or used in the combination of two or more.

The resin composition of the present invention may be prepared by blending, stirring and mixing of the modified polyphenylether resin, the silicone compound containing unsaturated double bonds, the radical initiator, the flame retardant, the powder filler, various thermosetting resins and various additives according to a publicly known method.

The second object of the present invention is to provide a resin solution, which is obtained by dissolving or dispersing the resin composition in a solvent. The solvent in the present invention has no particular restrictions; specific examples include alcohols such as methanol, ethanol and butanol, ethers such as ethyl cellosolve, butyl cellosolve, ethylene-methyl ether, carbitol and butyl carbitol, ketones such as acetone, butanone, methyl ethyl ketone, methyl isobutyl ketone and cyclohexanone, aromatic hydrocarbons such as toluene, xylene and mesitylene, esters such as ethoxyethyl acetate and ethyl acetate, nitrogen-containing solvents such as N,N-dimethylformamide, N,N-dimethylacetamide and N-methyl-2-pyrrolidone. These solvents can be used alone or used in a combination of two or more solvents, preferably, in a combination of aromatic hydrocarbons such as toluene, xylene and mesitylene and aromatic hydrocarbons such as toluene, xylene and mesitylene. The amount of the solvent can be selected by those skilled in the art according to their experience for the purpose of getting proper viscosity of the resin solution suitable for use.

In the dissolving and dispersing process of the resin composition in the solvent, an emulsifier may be added. The powder filler may be dispersed evenly in the resin solution through dispersing by means of the emulsifier.

The third object of the present invention is to provide a prepreg, which is prepared by soaking a glass fiber cloth in the above resin solution and then drying.

In the present invention, the glass fiber cloth is a reinforced material, which improves the strength, improves the dimensional stability and reduces the shrinkage in the thermosetting resin curing. Different types of glass fiber cloth may be chosen depending on the different requirements of the plate thickness; specific examples include 7628 glass fiber cloth and 2116 glass fiber cloth.

Taking the total weight of the modified polyphenylether resin, the silicone compound containing unsaturated double bonds, the flame retardant and the powder filler as 100 parts by weight, the glass fiber cloth accounts for 50~230 parts by weight, for example, 70 parts by weight, 90 parts by weight, 110 parts by weight, 150 parts by weight, 180 parts by weight, 200 parts by weight, 210 parts by weight or 220 parts by weight.

The drying temperature is 80-220° C., for example, 90° C., 110° C., 150° C., 170° C., 190° C. or 200° C. The drying time is 1-30 min, for example, 5 min, 8 min, 13 min, 17 min, 21 min, 24 min or 28 min.

The fourth object of the present invention is to provide a copper-clad plate, which comprises at least one of the above prepregs. The preparation of a copper-clad plate is known in the art.

The fifth object of the present invention is to provide an insulating plate, which comprises at least one of the above prepregs.

The sixth object of the present invention is to provide a covering film, which is prepared from the above resin solution.

The seventh object of the present invention is to provide a high-frequency circuit base plate, which comprises at least one of the above prepregs.

The preparation method of the high-frequency circuit base plate is known and those skilled in the art can refer to the known high-frequency circuit base plate preparation method to prepare the high-frequency circuit base plate. Exemplary method for preparing the high-frequency circuit base plate is: overlapping at least one of the above prepregs, placing the copper foil in the upper and lower sides of the overlapping prepreg, and then laminate molding.

Preferably, automatic stacking operation is used to simplify the technical operation.

Preferably, the laminate molding uses vacuum laminate molding, which can be achieved by a vacuum laminator. The lamination time may be 70-120 min, for example 75 min, 80 min, 85 min, 90 min, 95 min, 100 min, 105 min, 110 min, or 115 min. The lamination temperature may be 180-220° C., for example, 185° C., 190° C., 195° C., 200° C., 205° C., 210° C. or 215° C. The lamination pressure may be 0-60 kg/cm$^2$, for example 45 kg/cm$^2$, 50 kg/cm$^2$, 55 kg/cm$^2$ or 58 kg/cm$^2$.

Preferably, the copper foil is selected from high peeling inverted copper foil, low profile copper foil and supper low profile copper foil.

In the practice, the number of prepregs, the type of glass fiber cloth, the parts by weight of the glass fiber cloth and the resin composition are decided by the requirements such as the thickness of the high-frequency circuit base plate in the practice.

FIG. 1 is a schematic view of the high-frequency circuit base plate of the prepregs of the present invention. The number of the prepregs is 9 and preferably, the copper foil is selected from high peeling inverted copper foil, low profile copper foil and supper low profile copper foil.

The high-frequency circuit base plate containing the prepreg of the present invention has excellent dielectric property, heat resistance, low water absorption rate, and high interlayer adhesion strength.

A typical but not limited preparation method of the high-frequency circuit base plate of the present invention is as follows:

(1) The ingredients according to the formula of the above resin are weighed: taking the weight of the modified polyphenylether resin as 100 parts by weight, the silicone compound containing unsaturated double bonds accounts for 10-90 parts by weight; taking the total weight of modified polyphenylether resin and the silicone compound containing unsaturated double bonds as 100 parts by weight, the free radical initiator accounts for 1-3 parts by weight and the flame retardant accounts for 0-40 parts by weight; taking the total weight of modified polyphenylether resin, the silicone compound containing unsaturated double bonds and the flame retardant as 100 parts by weight, the powder filler accounts for 0-150 parts by weight.

(2) The modified polyphenylether resin, the silicone compound containing unsaturated double bonds, the free radical initiator, the powder filler and flames retardant, and then an appropriate amount of a solvent is added. The mixture is stirred for even dispersion, so that the powder filler and the flame retardant are uniformly dispersed in the resin solution. The glass fiber cloth is soaked in the prepared solution, and then dried by heating to get rid of the solvent to get the prepreg.

(3) At least one of the above prepregs is overlapped, and copper foils are placed on both sides of the prepreg, and then laminated and cured in a vacuum laminator to get the high-frequency circuit base plate.

"High-frequency" in the present invention means the frequency is higher than 1 MHz.

Compared with the prior art, the invention has the following advantages:

(1) A silicone compound containing multifunctional unsaturated double bonds is used as the cross-linker of the modified polyphenylether resin. The cross linking density of the resin composition is high, providing a high glass transition temperature for the high-frequency circuit base plate.

(2) A silicone compound containing multifunctional unsaturated double bonds does not have a polar group, guaranteeing low water absorption rate, and excellent dielectric property of the high-frequency circuit base plate.

(3) A silicone compound containing unsaturated double bonds is good at heat resistance providing excellent heat resistance for the high-frequency circuit base plate.

(4) A silicone compound containing multifunctional unsaturated double bonds is used as the cross-linker of the modified polyphenylether resin. The interlayer adhesion strength of the prepared high-frequency circuit base plate is high, improving the reliability of the base plate.

In brief, the high-frequency circuit base plate made by the modified polyphenylether resin and the silicone compound containing unsaturated double bonds has a high glass transition temperature, good heat resistance, low water absorption rate, high interlayer adhesion strength, and excellent dielectric property, making it very suitable for the preparation of the circuit base plate of the high-frequency electric devices.

FIG. 1 shows a diagram of the high-frequency circuit base plate of the present invention. In the drawings, "1" represents a prepreg and "2" represents a copper foil.

SPECIFIC EMBODIMENTS

For better illustrating the present invention to make the technical solution understood, the typical but not limiting embodiments are as follows:

TABLE 1

Starting material used in Embodiments 1-3

| Manufacturer | Product name or trademark | Material Description |
|---|---|---|
| Sabic | MX9000 | Modified polyphenylether resin |
| WD Silicone | WD-V4 | Silicon compound containing unsaturated double bonds |
| Shanghai Gaoqiao | DCP | Dicumyl peroxide |
| Dongguan Xinwei Chemical | BPO | Benzoyl peroxide |
| Sibelco | 525 | Fused silica |
| Bengbu Xinyuan | SJS-0020 | Spherical silica |
| Albemarle, U.S. | BT-93W | Brominated flame retardant |
| Clariant, Germany | Exolit OP935 | Phosphorus flame retardant |
| Shanghai Honghe | 2116 | Glass fiber cloth |

Embodiment 1

Ninety parts by weight of modified polyphenylether resin powder MX9000, 10 parts by weight of a silicone compound containing unsaturated double bonds, WD-V4, and 1.0 parts by weight of a free radical initiator, dicumyl peroxide (DCP), are dissolved in toluene solvent and then the solution is adjusted to suitable viscosity. The glass fiber cloth 2116 is soaked in the resin solution, goes over a clamp shaft to control suitable unit weight, and is then dried in an oven to get rid of the toluene solvent to get 2116 prepreg. Four pieces of 2116 prepregs are stacked with 1 OZ-thick copper foil on both upper and lower sides, and then vacuum-laminated and cured in a presser for 90 min under a curing pressure of 50 kg/cm² and a curing temperature of 200° C. to get a high-frequency circuit base plate. The physical properties are shown in Table 2.

Embodiment 2

Eighty parts by weight of a modified polyphenylether resin powder MX9000, 20 parts by weight of a silicone compound containing unsaturated double bonds, WD-V4, 3.0 parts by weight of a free radical initiator, dicumyl peroxide (DCP), 60 parts by weight of a fused silica 525 and 30 parts by weight of a flame retardant BT-93W are dissolved in toluene solvent and the solution is adjusted to suitable viscosity. The glass fiber cloth 2116 is soaked in the resin solution, goes over a clamp shaft to control suitable unit weight, and is then dried in an oven to get rid of the toluene solvent to get 2116 prepreg. Four pieces of 2116 prepregs are stacked with 1 oz. thick copper foil on both upper and lower sides, and then vacuum-laminated cured in a presser for 90 min under a curing pressure 50 kg/cm² and a curing temperature of 200° C. to get a high-frequency circuit base plate. The physical properties are shown in Table 2.

Embodiment 3

60 parts by weight of a modified polyphenylether resin powder MX9000, 40 parts by weight of a silicone compound containing unsaturated double bonds WD-V4, 1.0 parts by weight of a free radical initiator dicumyl peroxide (DCP), 2.0 parts by weight of a free radical initiator benzoyl peroxide (BPO), 170 parts by weight of a spherical silica SJS-0020 and 15 parts by weight of a flame retardant Exolit OP935 are dissolved in the toluene solvent and the solution is adjusted to suitable viscosity. The glass fiber cloth 2116 is soaked in the resin solution, goes over a clamp shaft to control suitable unit weight, and is then dried in an oven to get rid of the toluene solvent to get 2116 prepreg. Four pieces of 2116 prepregs are stacked with 1 oz. thick copper foil on both upper and lower sides, and are then vacuum-laminated and cured in a presser for 90 min under a curing pressure of 50 kg/cm² and a curing temperature of 200° C. to get a high-frequency circuit base plate. The physical properties are shown in Table 2.

Comparative Embodiment 1

Comparative embodiment 1 is the same as embodiment 2, except that the silicone compound containing unsaturated double bonds WD-V4 in embodiment 2 is replaced with a butadiene-styrene copolymer Ricon 100.

Comparative Embodiment 2

Comparative embodiment 2 is the same as embodiment 2, except that the silicone compound containing unsaturated double bonds WD-V4 in the embodiment 3 is replaced with a maleic anhydride-modified polybutadiene Ricon 131MA20.

Table 2 shows the composition and the results of the property tests of embodiments 1-3 and comparative embodiments 1-2.

TABLE 2

| Materials and properties | Embodiment 1 | Embodiment 2 | Embodiment 3 | Comparative Embodiment 1 | Comparative Embodiment 2 |
|---|---|---|---|---|---|
| MX9000 | 90 | 80 | 60 | 80 | 60 |
| WD-V4 | 10 | 20 | 40 | 0 | 0 |
| Ricon 100 | 0 | 0 | 0 | 20 | 0 |
| Ricon 131MA20 | 0 | 0 | 0 | 0 | 40 |
| DCP | 1 | 3 | 1.0 | 3 | 1.0 |
| BPO | 0 | 0 | 2.0 | 0 | 2.0 |
| 525 | 0 | 60 | 0 | 60 | 0 |
| SJS-0020 | 0 | 0 | 170 | 0 | 170 |
| BT-93W | 0 | 30 | 0 | 30 | 0 |
| Exolit OP935 | 0 | 0 | 15 | 0 | 15 |
| 2116 | 80 | 155 | 230 | 155 | 230 |
| Glass transition temperature (° C.) | 200.0 | 218.4 | 210.2 | 198.6 | 191.3 |
| Thermal decomposition temperature (° C.) | 455.0 | 425.3 | 433.5 | 398.5 | 414.3 |
| Solder dipping stability 288° C. | >300 | >300 | >300 | >300 | >300 |
| Water absorption rate | 0.06 | 0.06 | 0.06 | 0.06 | 0.11 |
| Interlayer adhesion strength | 1.56-2.96 | 1.86-2.76 | 1.53-2.79 | 0.44-0.61 | 0.8-1.1 |
| Dielectric constant (10 GHz) | 3.60 | 3.72 | 3.8 | 4.03 | 3.95 |
| Dielectric loss tangent (10 GHz) | 0.0078 | 0.0071 | 0.0060 | 0.0068 | 0.0075 |

As can be seen from the data in Table 2, compared with styrene-butadiene copolymer, when the silicone compound containing unsaturated double bonds is used as a cross-linker, the prepared high-frequency circuit base plate has a higher glass transition temperature, a higher thermal decomposition temperature and a higher interlayer adhesion strength and its dielectric property is similar to styrene-butadiene copolymer. So the silicone compound containing unsaturated double bonds is a cross-linker with excellent overall properties and can be used for high-frequency circuit base plate preparation.

Embodiment 4

Seventy parts by weight of a modified polyphenylether resin, 30 parts by weight of a silicone compound containing unsaturated double bonds, 2 parts by weight of a free radical initiator butyl 4,4-bis(tert-butyldioxy)valerate, 98 parts by weight of a silicon carbide and 40 parts by weight of a flame retardant Tris(2,6-dimethylphenyl)phosphine are dissolved in a mixed solvent of toluene and butanone and the solution is adjusted to suitable viscosity. 119 parts by weight of glass fiber cloth 7628 is soaked in the resin solution, goes over a clamp shaft to control suitable unit weight, and then it is dried in an oven to get rid of the toluene solvent to get 7628 prepreg. Four pieces of 7628 prepregs are stacked with 1 oz. thick copper foil on both upper and lower sides, and then vacuum-laminated and cured in a pressor for 90 min under a curing pressure of 50 kg/cm² and a curing temperature of 200° C. to get a high-frequency circuit base plate.

The structure of the modified polyphenylether is:

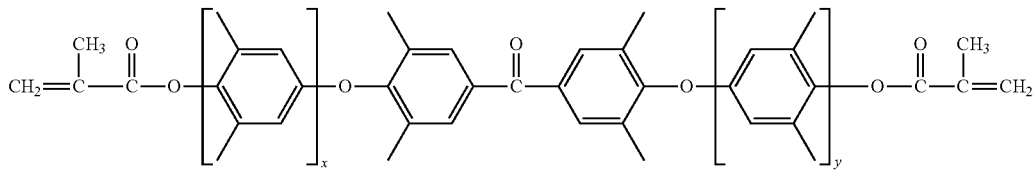

wherein $0 \le x \le 100$, $0 \le y \le 100$, $2 \le x+y \le 100$, and x and y is not 0 in the same time.

The molecular weight of the modified polyphenylether used in this embodiment is 10000 g/mol.

The structure of the silicone compound containing unsaturated double bonds is:

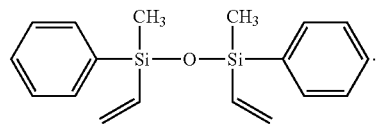 [SMILES: C=C[Si](C)(O[Si](C)(C=C)c1ccccc1)c1ccccc1]

Embodiment 5

Sixty parts by weight of a modified polyphenylether resin, 40 parts by weight of a silicone compound containing unsaturated double bonds, 1.5 parts by weight of a free radical initiator dibenzoyl peroxide, 125 parts by weight of an aluminum nitride, and 25 parts by weight of a flame retardant decabromodiphenyl oxide are dissolved in toluene solvent and the solution is adjusted to suitable viscosity. The powder filler and the flame retardant are dispersed evenly in the mixed solution through emulsifying by means of an emulsifier to get the resin solution. 575 parts by weight of glass fiber cloth 2116 is soaked in the resin solution, goes over a clamp shaft to control suitable unit weight, and then dried in an oven to get rid of the toluene solvent to get 2116 prepreg. Four pieces of 2116 prepregs are stacked with 1 oz. thick copper foil on both upper and lower sides, and then vacuum-laminated and cured in a presser for 90 min under a curing pressure of 50 kg/cm² and a curing temperature of 200° C. to get a high-frequency circuit base plate.

The structure of the modified polyphenylether is:

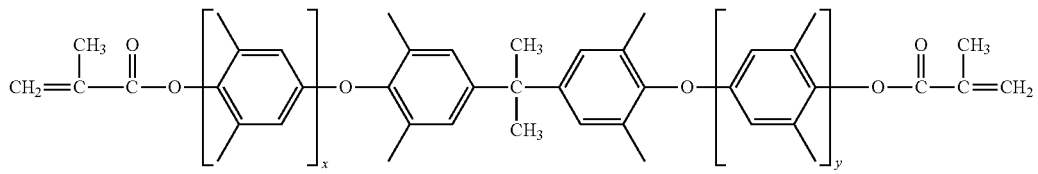

wherein, $0 \leq x \leq 100$, $0 \leq y \leq 100$, $2 \leq x+y \leq 100$, and x and y is not 0 in the same time.

The molecular weight of the modified polyphenylether used in this embodiment is 8000 g/mol.

The structure of the silicone compound containing unsaturated double bonds is:

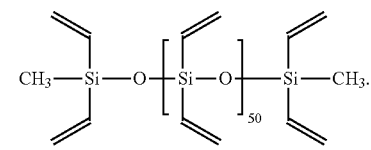

Embodiment 6

Fifty parts by weight of a modified polyphenylether resin, 50 parts by weight of a silicone compound containing unsaturated double bonds, 1 parts by weight of a free radical initiator dibenzoyl peroxide, 100 parts by weight of alumina and 30 parts by weight of a flame retardant decabromodiphenyl oxide are dissolved in toluene solvent and the solution is adjusted to suitable viscosity. The powder filler and the flame retardant are dispersed evenly in the mixed solution through emulsifying by means of an emulsifier to get the resin solution. 230 parts by weight of glass fiber cloth 2116 is soaked in the resin solution, goes over a clamp shaft to control suitable unit weight, and then dried in an oven to get rid of the toluene solvent to get 2116 prepreg. Four pieces of 2116 prepregs are stacked with 1 oz. thick copper foil on both upper and lower sides, and then vacuum-laminated and cured in a presser for 120 min under a curing pressure of 40 kg/cm² and a curing temperature of 180° C. to get a high-frequency circuit base plate.

The structure of the modified polyphenylether is:

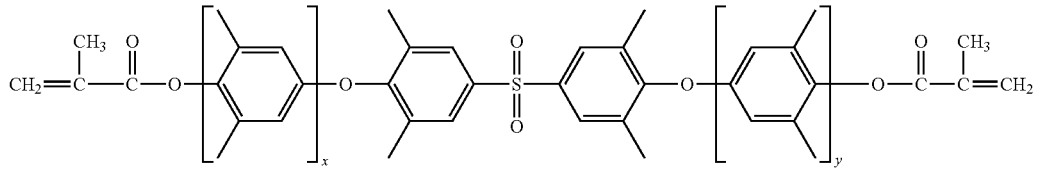

wherein $0 \leq x \leq 100$, $0 \leq y \leq 100$, $2 \leq x+y \leq 100$, and x and y is not 0 in the same time.

The molecular weight of the modified polyphenylether used in this embodiment is 2000 g/mol.

The structure of the silicone compound containing unsaturated double bonds is:

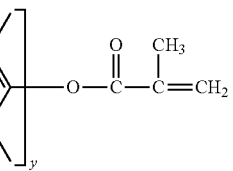

Embodiment 7

Sixty parts by weight of a modified polyphenylether resin, 40 parts by weight of a silicone compound containing unsaturated double bonds, 1.5 parts by weight of a free radical initiator dibenzoyl peroxide, 125 parts by weight of a boron nitride, and 25 parts by weight of a flame retardant decabromodiphenyl oxide are dissolved in toluene solvent and the solution is adjusted to suitable viscosity. The powder filler and the flame retardant are dispersed evenly in the mixed solution through emulsifying by means of an emulsifier to get the resin solution. 450 parts by weight of glass fiber cloth 2116 is soaked in the resin solution, goes over a clamp shaft to control suitable weight, and then dried in an oven to get rid of the toluene solvent to get 2116 prepreg. Four pieces of 2116 prepregs are stacked with 1 oz. thick copper foil on both upper and lower sides, and then vacuum-laminated and cured in a presser for 70 min under a curing pressure of 60 kg/cm² and a curing temperature of 220° C. to get a high-frequency circuit base plate.

The structure of the modified polyphenylether is:

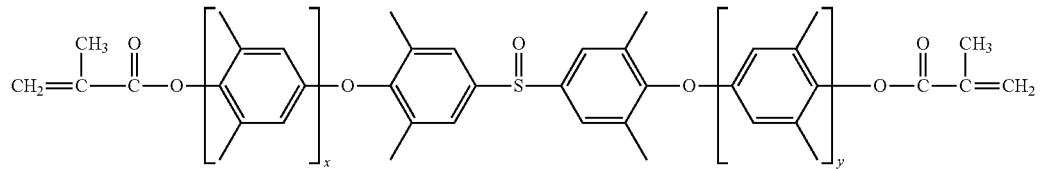

wherein 0≤x≤100, 0≤y≤100, 2≤x+y≤100, and x and y is not 0 in the same time.

The molecular weight of the modified polyphenylether used in this embodiment is 1000 g/mol.

The structure of the silicone compound containing unsaturated double bonds is:

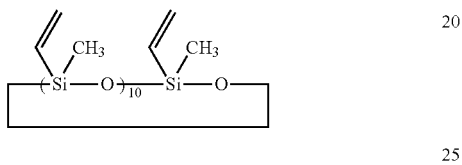

Table 3 shows the results of the property tests of the high-frequency circuit base plates of embodiments 4-7.

TABLE 3

| Properties | Embodiment 4 | Embodiment 5 | Embodiment 6 | Embodiment 7 |
|---|---|---|---|---|
| Glass transition temperature (° C.) | 205.4 | 208.3 | 210.2 | 208.9 |
| Thermal decomposition temperature (° C.) | 455.1 | 462.3 | 457.4 | 455.8 |
| Solder dipping stability 288° C. | >300 | >300 | >300 | >300 |
| Water absorption rate | 0.06 | 0.06 | 0.06 | 0.06 |
| Interlayer Adhesion strength | 1.66-2.76 | 1.45-2.66 | 1.35-2.54 | 0.44-0.61 |
| Dielectric constant (10 GHz) | 3.85 | 3.72 | 4.07 | 3.60 |
| Dielectric loss tangent (10 GHz) | 0.0086 | 0.0071 | 0.0067 | 0.0068 |

The present invention is described in a detailed method through the above embodiments, however, the present invention is not limited to the above detailed methods, i.e., it does not mean that the present invention must rely on the above detailed methods to be implemented. Persons skilled in the art should understand, any improvement of the present invention, the equivalent replacement to the raw materials of the present invention product, adding auxiliary ingredients and specific mode selection all fall within the protection scope and disclosure of the present invention.

What is claimed is:

1. A resin composition comprising a modified polyphenylether resin and an organic silicon compound containing unsaturated double bonds, wherein the organic silicon compound containing unsaturated double bonds is selected from the organic silicon compound structures containing unsaturated double bonds:

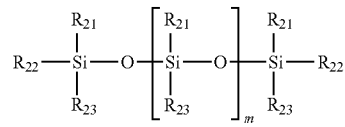

wherein $R_{21}$, $R_{22}$ and $R_{23}$ are independently selected from substituted/unsubstituted C1-C8 linear chain alkyl groups, substituted/unsubstituted C1-C8 branch chain alkyl groups, substituted/unsubstituted phenyl groups and substituted/unsubstituted C2-C10 C=C-containing groups; at least one of $R_{21}$, $R_{22}$ and $R_{23}$ is substituted/unsubstituted C2-C10 C=C-containing groups; and 0≤m≤100;

or,

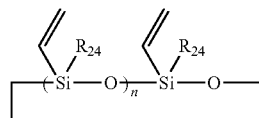

wherein $R_{24}$ is selected from substituted/unsubstituted C1-C12 linear chain alkyl groups and substituted/unsubstituted C1-C12 branch chain alkyl groups; 2≤n≤10, and n is a natural number; and wherein the resin composition comprises a free radical initiator and wherein the modified polyphenylether resin has the following structure;

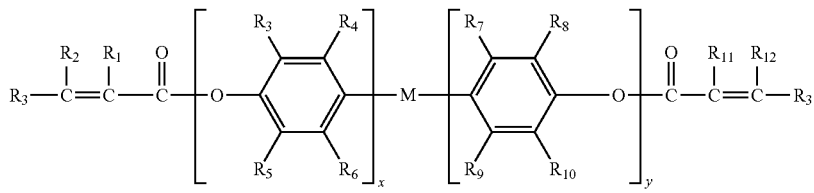

wherein 0≤x≤100, 0≤y≤100, 2≤x+y≤100, and x and y is not 0 at the same time;

M is selected from:

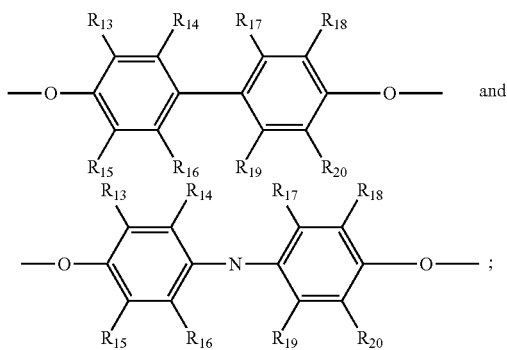

N is any one selected from —CO—, SO, —SO$_2$— and —C(CH$_3$)$_2$—;

R$_3$, R$_5$, R$_8$, R$_{10}$, R$_{13}$, R$_{15}$, R$_{18}$ and R$_{20}$ are independently selected from substituted/unsubstituted C1-C8 linear chain alkyl groups, substituted/unsubstituted C1-C8 branch chain alkyl groups and substituted/unsubstituted phenyl groups;

R$_4$, R$_6$, R$_7$, R$_9$, R$_{14}$, R$_{16}$, R$_{17}$ and R$_{19}$ are independently selected from hydrogen atom, substituted/unsubstituted C1-C8 linear chain alkyl groups, substituted/unsubstituted C1-C8 branch chain alkyl groups and substituted/unsubstituted phenyl groups;

R$_1$, R$_2$, R$_{11}$ and R$_{12}$ are independently selected from substituted/unsubstituted C1-C8 linear chain alkyl groups and substituted/unsubstituted C1-C8 branch chain alkyl groups.

2. The resin composition of claim 1 wherein the number average molecular weight of the modified polyphenylether resin is 500-10000 g/mol.

3. The resin composition of claim 1, wherein the free radical initiator is selected from any one or a mixture of at least two selected from di-tert-butyl peroxide, dilauroyl peroxide, dibenzoyl peroxide, cumyl peroxyneodecanoate, tert-butyl peroxyneodecanoate, tert-Amyl peroxy pivalate, tert-butyl Peroxypivalate, tert-butyl peroxyisobutyrate, hexaneperoxoic acid-3,5,5-trimethyl-1,1-dimethylethyl ester, tert-butyl peroxyacetate, tert butylperoxy benzoate, 1,1-di(tert-butylperoxy)-3,3,5-trimethylcyclohexane, 1,1-di(tert-butylperoxy)cyclohexane, 2,2-di(tert-butylperoxy)butane, bis(4-tert-butylcyclohexyl) peroxydicarbonate, hexadecyl peroxydicarbonate, tetradecyl peroxydicarbonate, Di-tert amyl peroxide, dicumyl peroxide, bis(1-(tert-butylperoxy)-1-methylethyl)-benzene, 2,5-dimethyl-2,5-di(tert-butyl peroxide)hexane, 2,5-dimethyl-2,5-di(tertiary-butylperoxy)-hexyne-3, diisopropylbenzenehydroperoxide (DIBHP), isopropyl benzene hydroperoxide, tert-Amyl hydroperoxide, tert-butyl hydroperoxide, cumyl t-butyl peroxide, diisopropylbenzenehydroperoxide (DIBHP), Tert-Butyl peroxy-2-ethylhexanoate, tert-Butylperoxy 2-ethylhexyl carbonate, Butyl 4,4-bis(tert-butyldioxy)valerate, methyl ethyl ketone peroxide and peroxide cyclohexane.

4. The resin composition of claim 1 wherein the resin composition further compromises a flame retardant.

5. The resin composition of claim 4, wherein the flame retardant is selected from a halogenated flame retardant, a phosphorus flame retardant, a nitrogen flame retardant, or a mixture of two or more thereof.

6. The resin composition of claim 5, wherein the brominated flame retardant is selected from decabromodiphenyl oxide, decabromodiphenyl ethane ethylene bis (tetrabromophthalimide), or a mixture of two or more thereof.

7. The resin composition of claim 5, wherein the phosphorus flame retardant is one or a mixture of at least two selected from Tris(2,4-dimethylphenyl)phosphine, 10-(2,5-Dihydroxyphenyl)-10H-9-oxa-10-phospha-phenantbrene-10-oxide, 2,6-bis(2,6-dimethylphenyl) phosphinophenyl or 10-phenyl-9,10-Dihydro-9-oxa-10-phosphaphenanthrene 10-oxide.

8. The resin composition of claim 5, wherein the nitrogen flame retardant is one or a mixture of at least two selected from melamine, melamine phosphate, guanidine phosphate, guanidine carbonate or guanidine sulfamate.

9. The resin composition of claim 4, wherein the resin composition compromises powder filling material.

10. The resin composition of claim 9, wherein the powder filling material is one or a mixture of at least two selected from crystalline silica, amorphous silica, spherical silica, fused silica, titania, silicon carbide, glass fiber, alumina, aluminum nitride, boron nitride, barium titanate or strontium titanate.

11. The resin composition of claim 9, wherein the resin composition comprises:

taking the weight of the modified polyphenylether resin as 100 parts by weight, the organic silicon compound containing unsaturated double bonds counts for 10~90 parts by weight;

taking the total weight of the modified polyphenylether resin and the organic silicon compound containing unsaturated double bonds as 100 parts by weight, the free radical initiator counts for 1~3 parts by weight and the flame retardant counts for 0~40 parts by weight; and taking the total weight of modified polyphenylether resin, the organic silicon compound containing unsaturated double bonds and the flame retardant as 100 parts by weight, the weight of the powder filling material is 0~150 parts by weight.

12. A resin solution, which is prepared by dissolving or dispersing the resin composition according to claim 1 in a solvent.

13. A prepreg, which is prepared by soaking a glass fiber cloth in the resin solution of claim 12 and then drying.

14. A copper-clad plate, which comprises at least one prepreg of claim 13.

15. An insulating plate, which comprises at least one prepreg of claim 13.

16. A covering film, which is prepared from the resin solution of claim 12.

17. A high-frequency circuit base plate, which comprises at least one prepreg of claim 13.

\* \* \* \* \*